(12) United States Patent
Zhang et al.

(10) Patent No.: US 9,316,870 B2
(45) Date of Patent: Apr. 19, 2016

(54) LIQUID CRYSTAL DISPLAY DEVICE AND A MANUFACTURING METHOD THEREOF

(71) Applicant: BOE Technology Group Co., Ltd., Beijing (CN)

(72) Inventors: Yuting Zhang, Beijing (CN); Jing Lv, Beijing (CN); Zheng Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 50 days.

(21) Appl. No.: 14/049,372

(22) Filed: Oct. 9, 2013

(65) Prior Publication Data

US 2014/0098320 A1 Apr. 10, 2014

(30) Foreign Application Priority Data

Oct. 9, 2012 (CN) .......................... 2012 1 0380833

(51) Int. Cl.
*G02F 1/1339* (2006.01)
*G02F 1/1333* (2006.01)
(Continued)

(52) U.S. Cl.
CPC ............ *G02F 1/1339* (2013.01); *G02F 1/1368* (2013.01); *G02F 1/13439* (2013.01); *G02F 1/133345* (2013.01); *G02F 1/133512* (2013.01); *G02F 1/133514* (2013.01); *G02F 1/136227* (2013.01); *G02F 1/136286* (2013.01); *H01L 27/1259* (2013.01); *G02F 1/13458* (2013.01); *G02F 2001/136231* (2013.01); *G02F 2201/50* (2013.01)

(58) Field of Classification Search
CPC combination set(s) only.
See application file for complete search history.

(56) References Cited

U.S. PATENT DOCUMENTS 5,764,320 A 6/1998 Konuma et al.
6,288,764 B1 * 9/2001 Zhang .................. G02F 1/1339
349/152

(Continued)

FOREIGN PATENT DOCUMENTS

CN 1996115 A 7/2007
CN 202083862 U 12/2011
(Continued)

OTHER PUBLICATIONS

First Office Action issued by the Chinese Patent Office for Chinese Patent Application No. 201210380833.6 dated Aug. 1, 2014, 5pgs.
(Continued)

*Primary Examiner* — Wen-Ying P Chen
(74) *Attorney, Agent, or Firm* — Ladas & Parry LLP

(57) ABSTRACT

Embodiments of the present invention provide a liquid crystal display device and a manufacturing method thereof. The device comprises: an upper substrate, comprising: substrate; a color filter and a black matrix, formed on a surface of the substrate facing a lower substrate in the same layer; a lower substrate, cell-assembled with the upper substrate and comprising: a base substrate; a gate metal bus, a gate insulating layer, a source/drain metal bus and a first insulating protection layer, which are formed on the base substrate sequentially; a transparent electrode, formed on the first insulating protection layer; and a second insulating protection layer, covering the transparent electrode; and a seal agent, provided at a periphery of a display area of the liquid crystal display device, wherein an upper portion of the seal agent is attached to the substrate and a lower portion thereof is attached to the second insulating protection layer.

9 Claims, 2 Drawing Sheets

(51) Int. Cl.
  *G02F 1/1335* (2006.01)
  *G02F 1/1343* (2006.01)
  *G02F 1/1368* (2006.01)
  *H01L 27/12* (2006.01)
  *G02F 1/1345* (2006.01)
  *G02F 1/1362* (2006.01)

(56) References Cited

U.S. PATENT DOCUMENTS

2006/0001789 A1* 1/2006 Ahn ............................... 349/42
2010/0134745 A1* 6/2010 Lee et al. ...................... 349/153
2013/0169913 A1* 7/2013 Choi et al. .................... 349/110

FOREIGN PATENT DOCUMENTS

JP    H10111515 A    4/1998
JP    2004004526 A   1/2004

OTHER PUBLICATIONS

English translation of First Office Action issued by the Chinese Patent Office for Chinese Patent Application No. 201210380833.6 dated Aug. 1, 2014, 5pgs.

Extended European Search Report issued by the European Patent Office on Jan. 1, 2014 for International Application No. 13187899.1, 8 pages.

* cited by examiner

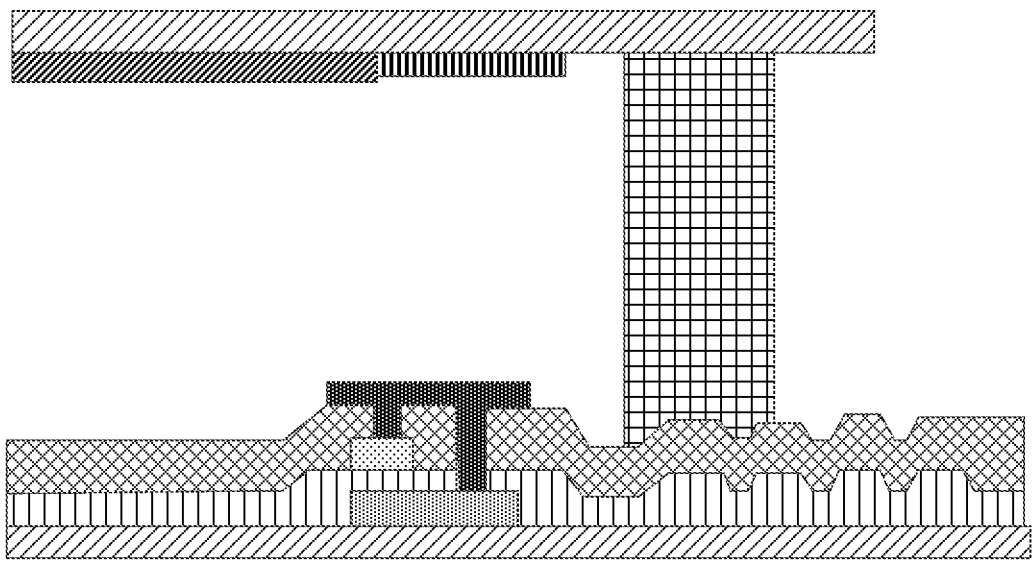
Fig. 1 - Prior Art
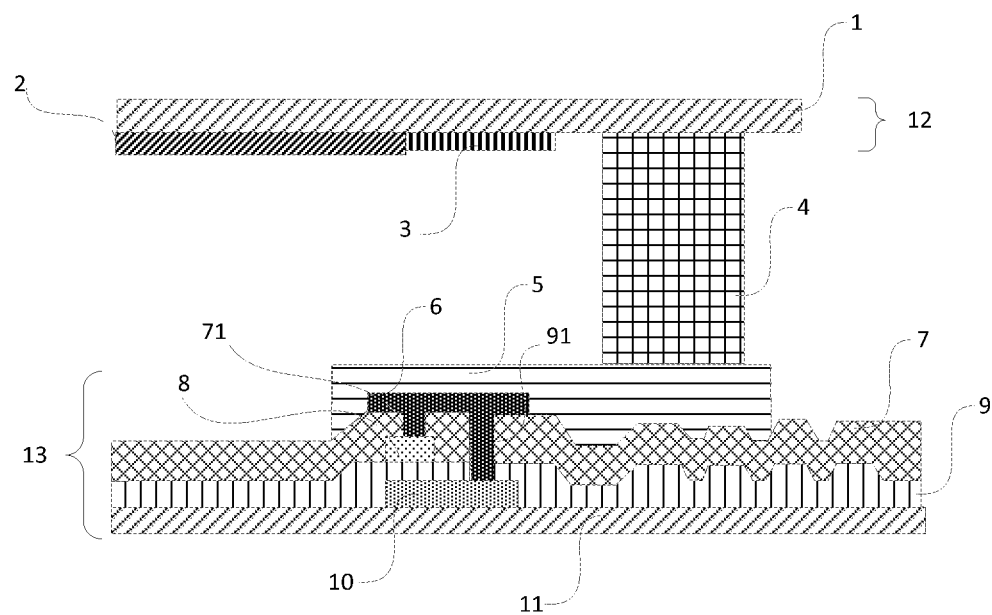
Fig. 2

LIQUID CRYSTAL DISPLAY DEVICE AND A MANUFACTURING METHOD THEREOF

CROSS REFERENCE TO RELATED APPLICATIONS

This application claims priority from Chinese National Application No. 201210380833.6 filed on Oct. 9, 2012, the contents of which are incorporated herein by reference.

TECHNICAL FIELD

Embodiments of the present invention relate to a liquid crystal display device and a manufacturing method thereof.

BACKGROUND

Currently, liquid crystal display devices play a leading role in the current flat panel display market due to features of excellent display quality, relatively low manufacturing cost, low power consumption, no-radiation and the like, and the display quality is also improved constantly with development of the manufacturing process technology.

Current liquid crystal display devices are formed by injecting liquid crystal between two substrates which are sealed with a seal agent and respectively attaching polarizers onto the two substrates, wherein the polarizers have polarization directions perpendicular to each other. Herein, the upper substrate is a color filter substrate and the lower substrate is an array substrate, and many thin film transistors arranged in the form of matrix and some peripheral circuits are prepared on the array substrate.

FIG. 1 is a cross-sectional structural view of a frame portion of a current liquid crystal display device, wherein the frame is formed by curing a seal agent. As shown in FIG. 1, to prevent generation of static electricity, near the frame, a part of a gate metal bus needs to be connected with a part of the source/drain metal bus through a transparent electrode. However, during manufacturing the liquid crystal display device, the metal electrode, that is, the transparent electrode, near the frame of the liquid crystal display device may be eroded when the seal agent is cured; also, in a narrow-frame TV product, the seal agent is required to be close to a display region as much as possible, therefore, a risk that the seal agent erodes the metal electrode increases further.

SUMMARY

Embodiments of the present invention provide a liquid crystal display device and a manufacturing method thereof, which can prevent a seal agent from eroding a metal electrode near a frame of the liquid crystal display device.

In one aspect, an embodiment of the present invention provides a liquid crystal display device, comprising: an upper substrate, comprising: a substrate; a color filter, formed on a surface of the substrate facing a lower substrate; and a black matrix, formed in the same layer with the color filter; a lower substrate, cell-assembled with the upper substrate and comprising: a base substrate; a gate metal bus, a gate insulating layer, a source/drain metal bus and a first insulating protection layer, which are formed on the base substrate sequentially; a transparent electrode, formed on the first insulating protection layer; and a second insulating protection layer, covering the transparent electrode; and a seal agent, provided at a periphery of a display area of the liquid crystal display device, wherein an upper portion of the seal agent is attached to the substrate and a lower portion thereof is attached to the second insulating protection layer.

In another aspect, an embodiment of the present invention provides a manufacturing method of a liquid crystal display device, comprising following steps: Step A: sequentially forming a gate metal bus, a gate insulating layer, a source/drain metal bus and a first insulating protection layer on a base substrate, wherein, a first through hole passing through the gate insulating layer and the first insulating protection layer is formed above the gate metal bus to expose a part of the gate metal bus; Step B: on the base substrate obtained after the step A, forming a second through hole above the source/drain metal bus, which penetrates through the first insulating protection layer to expose a part of the source/drain metal bus; Step C: on the base substrate obtained after the step B, forming a transparent electrode connecting the gate metal bus and the source/drain metal bus through the first through hole and the second through hole above the first insulating protection layer; Step D: forming a second insulating protection layer on the base substrate obtained after the step C which covers the transparent electrode, so that obtaining a lower substrate; and Step E: using a seal agent to adhere an upper substrate comprising a color filter and a black matrix at the same layer and the second insulating protection layer, and using an ultraviolet ray mask to irradiate and cure the seal agent.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a schematic cross-sectional structural view of a frame portion of a current liquid crystal display device;

FIG. 2 is a schematic cross-sectional structural view of a frame portion of a liquid crystal display device according to a first embodiment of the present invention.

DETAILED DESCRIPTION

Figure 3:
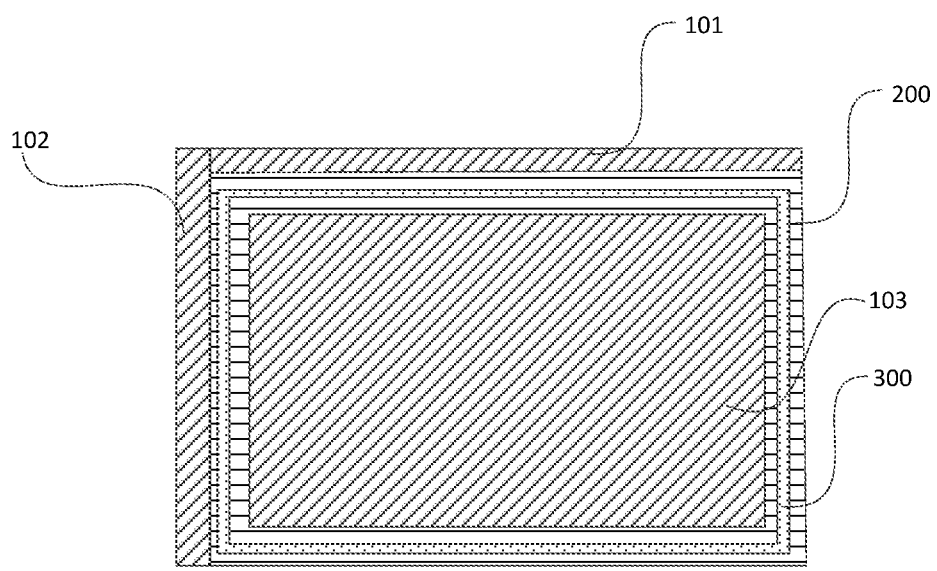
FIG. 3 is a plan view of an ultraviolet light mask used to form a transparent electrode in a manufacturing method of a liquid crystal display device according to a second embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

FIG. 2 shows a cross-sectional structural view of a frame portion of a liquid crystal display device according to a first embodiment of the present invention. As shown in FIG. 2, the liquid crystal display device according to the first embodiment of the present invention comprises: an upper substrate 12, comprising: a substrate 1; a color filter 2, formed on a surface of the substrate 1 facing a lower substrate 13; and a black matrix 3 formed in the same layer with the color filter 2; the lower substrate 13, cell-assembled with the upper substrate 12, and comprising: a base substrate 11; a gate metal bus 10, a gate insulating layer 9, a source/drain metal bus 8 and a first insulating protection layer 7 which are formed on the base substrate 11 sequentially; a transparent electrode 6, formed on the first insulating protection layer 7; and a second insulating protection layer 5, covering the transparent electrode 6 and extending to a periphery of a display area of the liquid crystal display device; and a seal agent 4, provided at the periphery of the display area of the liquid crystal display device, wherein a upper portion of the seal agent 4 is attached to the substrate 1 and a lower portion thereof is attached to the second insulating protection layer 5, and a first through hole 91 passing through the gate insulating layer 9 and the first insulating protection layer 7 is provided above the gate metal bus 10 to expose a part of the gate metal bus 10, a second through hole 71 passing through the first insulating protection layer 7 is provided above the source/drain metal bus 8 to expose a part of the source/drain metal bus 8, and the transparent electrode 6 connects the gate metal bus 10 and the source/drain metal bus 8 through the first through hole 91 and the second through hole 71.

Illustratively, the lower substrate 13 is an array substrate, and the base substrate 11 is a base substrate of the array substrate, for example, a glass substrate, and the upper substrate 12 is a color filter substrate, and the substrate 1 is a base substrate of the color filter substrate, for example, a glass substrate.

Illustratively, the seal agent herein can use an ultraviolet curing seal agent, and by providing a reflector below the base substrate 11, and by irradiating an ultraviolet light from an upper substrate 12 side, a cured seal agent 4 can be formed.

Illustratively, coating and curing the seal agent can be performed by using a seal agent coating device comprising an ultraviolet irradiating member, thus when sprayed out from a nozzle of the seal agent coating device, the seal agent can be irradiated to be pre-cured, and then the possibility that the seal agent reacts with liquid crystal molecules during subsequent seal agent curing is lowered.

Compared with a current liquid crystal display device in FIG. 1, it can be seen that the liquid crystal display device according to the present embodiment can effectively avoid a risk that the seal agent 4 erodes the transparent electrode 6 by adding the second insulating protection layer 5; meanwhile, due to the arrangement of the second insulating protection layer 5, the seal agent 4 can get close to the display area as much as possible, which helps narrow a frame of the liquid crystal display device; further, the lower portion of the seal agent 4 is directly attached to the second insulating protection layer 5, which reduces a height of the seal agent 4, favors curing the seal agent 4 and lowers the possibility that the seal agent 4 pollutes the liquid crystal molecules.

The embodiment of the present invention only describes and illustrates the frame portion of the liquid crystal display device, and structures of the other portions of the liquid crystal display device can use the common structures in the art, and, for simplicity, are not described herein.

A Second Embodiment

A second embodiment of the present invention provides a manufacturing method of the liquid crystal display device according to the first embodiment of the present invention. Herein, the manufacturing of a frame portion of the liquid crystal display device is mainly described, and the other portions of the liquid crystal display device can be manufactured by using any conventional method, which are not detailed herein for simplicity.

The manufacturing method of the liquid crystal display device according to the second embodiment of the present invention comprises following steps:

Step A: sequentially forming a gate metal bus, a gate insulating layer, a source/drain metal bus and a first insulating protection layer on a base substrate, wherein, the gate metal bus and the source/drain metal bus are formed by respectively depositing a gate metal layer and a source/drain metal layer, coating a photoresist, exposing, developing, etching and stripping, the gate insulating layer and the first insulating protection layer can be formed by depositing insulating material using, for example, a chemical vapor deposition method, and specific process parameters and methods are the same as a conventional manufacturing process of the liquid crystal display device, which are not described herein for simplicity, wherein a first through hole passing through the gate insulating layer and the first insulating protection layer is formed above the gate metal bus to expose a part of the gate metal bus.

Step B: on the base substrate obtained after the step A, forming a second through hole above the source/drain metal bus, which penetrates through the first insulating protection layer to expose a part of the source/drain metal bus.

Step C: on the base substrate obtained after the step B, forming a transparent electrode connecting the gate metal bus and the source/drain metal bus through the first through hole and the second through hole above the first insulating protection layer, wherein, the transparent electrode is formed by depositing a transparent electrode layer, coating a photoresist, exposing and developing the photoresist, etching and stripping, and specific process parameters and methods are the same as a conventional manufacturing process of the liquid crystal display device, which are not described herein for simplicity.

Step D: forming a second insulating protection layer on the base substrate obtained after the step C which covers the transparent electrode and extends to the periphery of a display region of the liquid crystal display device, so that obtaining a lower substrate.

Illustratively, the step D comprises following steps:

Step D1: using a conventional depositing process, for example, a chemical vapor deposition process, to sequentially deposit insulating material and a photoresist over the first insulating protection layer and the transparent electrode; and Step D2: using an ultraviolet light mask to expose the photoresist on the insulating material, and developing the photoresist;

Illustratively, FIG. 3 shows a plan view of the ultraviolet light mask used to form the transparent electrode in the manufacturing method of the liquid crystal display device according to the second embodiment of the present invention, and as shown in FIG. 3, the ultraviolet light mask comprises: an light-blocking region comprising a sub-mask 101 corresponding to a Data Pad region, a sub-mask 102 corresponding to a Gate Pad region and a sub-mask 103 corresponding to the display region; and a light-transmitting region comprising a region 200 corresponding to the second insulating protection layer to be formed and a region 300 corresponding to the seal agent. Illustratively, ultraviolet light is usually used to expose and develop the photoresist coated on the insulating material.

D3: under protection of the exposed and developed photoresist, etching the insulating material to form the second insulating protection layer.

D4: removing a residual photoresist.

Step E: using a seal agent to adhere an upper substrate comprising a color filter and a black matrix at the same layer and the second insulating protection layer, and using the ultraviolet light mask to irradiate and cure the seal agent.

Illustratively, the step E comprises following steps:

E1: coating the seal agent at the periphery of the display area of the liquid crystal display device so that it adheres the upper substrate and the second insulating protection layer; and E2: using the ultraviolet light mask to irradiate and cure the seal agent.

Illustratively, coating and curing the seal agent can be performed by using a seal agent coating device comprising an ultraviolet irradiating member, thus when sprayed out from a nozzle of the seal agent coating device, the seal agent can be irradiated to be pre-cured, and thus the possibility that the seal agent reacts with liquid crystal molecules during subsequent seal agent curing is lowered.

Illustratively, the seal agent herein can use an ultraviolet curing seal agent, and by providing a reflector below the base substrate, and by irradiating ultraviolet light from an upper substrate side, a cured seal agent 4 can be formed.

Referring to FIG. 3, the region 200 of the ultraviolet light mask corresponding to the second insulating protection layer is a light-transmitting region which comprises the region 300 corresponding to the seal agent, thus, the ultraviolet light mask can also be used during curing the seal agent. That is to say, the method of the present embodiment manufactures the second insulating protection layer at the periphery of the liquid crystal display device without adding the number of the mask.

With the liquid crystal display device and the manufacturing method thereof according to the embodiments of the present invention, by providing the second insulating protection layer above the transparent electrode of the liquid crystal display device which extends to the periphery of the display region, the metal electrode can be effectively prevented from being eroded by the seal agent, so that the seal agent can get close to the display region as much as possible, which thus helps narrow a frame of the liquid crystal display device; meanwhile, a height of the seal agent is lowered, so that it can be easily cured and the possibility of polluting the liquid crystal molecules is lowered. Further, the mask for forming the second insulating protection layer and the mask for curing the seal agent are the same mask, and thus, the number of the mask is not increased.

It should be understood by those skilled in the art that various changes and modifications may be made in these embodiments without departing from the scope and spirit of the present invention. If these changes and modifications fall into the range of the claims and their equivalents, the present invention also is directed to include these changes and modifications.

The invention claimed is:

1. A manufacturing method of a liquid crystal display device, the liquid crystal display device, comprising:
   an upper substrate, comprising:
      a substrate;
      a color filter, formed on a surface of the substrate facing a lower substrate; and
      a black matrix, formed in the same layer with the color filter;
   a lower substrate, cell-assembled with the upper substrate and comprising:
      a base substrate;
         a gate metal bus, a gate insulating layer, a source/drain metal bus and a first insulating protection layer, which are formed on the base substrate sequentially at a periphery of a display area of the liquid crystal display device;
         a transparent electrode, formed on the first insulating protection layer at the periphery of the display area of the liquid crystal display device; and
         a second insulating protection layer, covering the transparent electrode at the periphery of the display area of the liquid crystal display device; and
         a seal agent, provided at the periphery of the display area of the liquid crystal display device,
   wherein an upper portion of the seal agent is attached to the substrate and directly contacts the substrate and a lower portion thereof is attached to the second insulating protection layer,
   wherein the gate insulating layer directly contacts the source/drain metal bus, the manufacturing method, comprising following steps:
   Step A: sequentially forming a gate metal bus, a gate insulating layer, a source/drain metal bus and a first insulating protection layer on a base substrate at a periphery of a display area of the liquid crystal display device, wherein, a first through hole passing through the gate insulating layer and the first insulating protection layer is formed above the gate metal bus to expose a part of the gate metal bus;
   Step B: on the base substrate obtained after the step A, forming a second through hole above the source/drain metal bus, which penetrates through the first insulating protection layer to expose a part of the source/drain metal bus;
   Step C: on the base substrate obtained after the step B, forming a transparent electrode connecting the gate metal bus and the source/drain metal bus through the first through hole and the second through hole above the first insulating protection layer at the periphery of the display area of the liquid crystal display device;
   Step D: forming a second insulating protection layer on the base substrate obtained after the step C which covers the transparent electrode, so that obtaining a lower substrate; and
   Step E: using a seal agent to adhere an upper substrate comprising a color filter and a black matrix at the same layer and the second insulating protection layer, and using an ultraviolet ray mask to irradiate and cure the seal agent,
   wherein the gate insulating layer directly contacts the source/drain metal bus,
   wherein, the step D comprises following steps:
   Step D1: sequentially depositing insulating material and a photoresist over the first insulating protection layer and the transparent electrode;
   Step D2: exposing the photoresist on the insulating material using the ultraviolet light mask, and developing the photoresist;
   Step D3: under protection of the exposed and developed photoresist, etching the insulating material to form the second insulating protection layer; and
   Step D4: removing a residual photoresist.

2. The method according to claim 1, wherein, the step E comprises following steps:

E1: coating the seal agent at the periphery of the display area of the liquid crystal display device so that it adheres the upper substrate and the second insulating protection layer; and E2: using the ultraviolet light mask to irradiate and cure the seal agent.

3. The method according to claim 1, wherein, the seal agent is an ultraviolet curing seal agent.

4. The method according to claim 1, wherein, the liquid crystal display device is a narrow-frame liquid crystal display device.

5. The method according to claim 2, wherein, the using the ultraviolet light mask to irradiate and cure the seal agent comprises: providing a reflector below the base substrate; and curing the seal agent by irradiating ultraviolet light from an upper substrate side.

6. The method according to claim 2, wherein, the seal agent is coated by using a seal agent coating device comprising an ultraviolet irradiating member, and the seal agent is pre-cured when coated.

7. The method according to claim 1, wherein, the ultraviolet light mask comprises an ultraviolet light-transmitting region and an ultraviolet light-blocking region.

8. The method according to claim 7, wherein, the ultraviolet light-transmitting region corresponds to regions where the second insulating protection layer is located.

9. The method according to claim 7, wherein, the ultraviolet light-blocking region corresponds to a Data Pad region, a Gate Pad region and a display region.

\* \* \* \* \*